US012376442B2

(12) United States Patent
Lopez-Julia et al.

(10) Patent No.: US 12,376,442 B2
(45) Date of Patent: Jul. 29, 2025

(54) HIGH BRIGHTNESS DIRECTIONAL DIRECT EMITTER WITH PHOTONIC FILTER OF ANGULAR MOMENTUM

(71) Applicant: LUMILEDS LLC, San Jose, CA (US)

(72) Inventors: Antonio Lopez-Julia, Vaals (NL); Venkata Ananth Tamma, San Jose, CA (US)

(73) Assignee: Lumileds LLC, San Jose, CA (US)

( * ) Notice: Subject to any disclaimer, the term of this patent is extended or adjusted under 35 U.S.C. 154(b) by 903 days.

(21) Appl. No.: 17/416,963

(22) PCT Filed: Dec. 20, 2019

(86) PCT No.: PCT/IB2019/001351
§ 371 (c)(1),
(2) Date: Jun. 21, 2021

(87) PCT Pub. No.: WO2020/128621
PCT Pub. Date: Jun. 25, 2020

(65) Prior Publication Data
US 2022/0082742 A1  Mar. 17, 2022

Related U.S. Application Data

(63) Continuation of application No. 16/230,760, filed on Dec. 21, 2018, now Pat. No. 11,041,983.

(30) Foreign Application Priority Data

Feb. 13, 2019 (EP) .................... 19156830

(51) Int. Cl.
*G02B 5/26* (2006.01)
*H10H 20/80* (2025.01)
(Continued)

(52) U.S. Cl.
CPC ............ *H10H 20/872* (2025.01); *G02B 5/26* (2013.01); *H10H 20/841* (2025.01); *H10H 20/856* (2025.01); *G02B 2207/101* (2013.01)

(58) Field of Classification Search
CPC ................ G02B 5/26; G02B 2207/101; H10H 20/0363; H10H 20/872; H10H 20/84; H10H 20/841; H10H 20/855; H10H 20/856
See application file for complete search history.

(56) References Cited

U.S. PATENT DOCUMENTS 8,430,539 B2 * 4/2013 Matsuzaki ........... G02B 5/0252
362/97.4
2004/0016936 A1 * 1/2004 Tanaka .................... H01L 33/20
257/E33.068
(Continued)

FOREIGN PATENT DOCUMENTS

CN  103511572 A  9/2018
CN  108803088 A  11/2018
(Continued)

OTHER PUBLICATIONS

The extended European Search Report corresponding to EP 19156830.2, Jul. 31, 2019, 9 pages.
(Continued)

*Primary Examiner* — Bao-Luan Q Le

(57) ABSTRACT

A nano-structure layer is disclosed. The nano-structure layer includes a plurality of nano-photonic structures that are configured in a first configuration such that light incident upon the nanostructured layer below a cut-off angle passes through the nanostructured layer and light incident upon the nanostructured layer above the cut-off angle is reflected back in direction of the incidence.

15 Claims, 14 Drawing Sheets

(51) Int. Cl.
*H10H 20/841* (2025.01)
*H10H 20/856* (2025.01)

(56) References Cited

U.S. PATENT DOCUMENTS

| | | | |
|---|---|---|---|
| 2004/0080938 A1* | 4/2004 | Holman | F21S 41/12 |
| | | | 362/245 |
| 2004/0218390 A1* | 11/2004 | Holman | H04N 9/315 |
| | | | 257/E33.072 |
| 2004/0263061 A1* | 12/2004 | Ishikawa | H10K 59/879 |
| | | | 313/112 |
| 2006/0192217 A1* | 8/2006 | David | H01L 33/20 |
| | | | 257/E33.068 |
| 2007/0236628 A1* | 10/2007 | Epstein | G02B 5/3058 |
| | | | 349/67 |
| 2010/0084671 A1* | 4/2010 | Xu | H01L 33/44 |
| | | | 257/98 |
| 2011/0090697 A1* | 4/2011 | Matsuzaki | G02B 5/0215 |
| | | | 362/293 |
| 2011/0198619 A1* | 8/2011 | Chiang | H01L 25/0753 |
| | | | 257/E33.068 |
| 2016/0111598 A1 | 4/2016 | Cho et al. | |
| 2016/0131808 A1* | 5/2016 | Kristensen | B29C 33/3842 |
| | | | 359/884 |
| 2016/0181485 A1* | 6/2016 | Lee | H01L 33/505 |
| | | | 428/206 |
| 2018/0274750 A1 | 9/2018 | Byrnes et al. | |
| 2021/0074885 A1* | 3/2021 | Nakamura | H01L 25/0753 |
| 2021/0102686 A1* | 4/2021 | Robinson | H01L 25/0753 |

FOREIGN PATENT DOCUMENTS

| | | |
|---|---|---|
| EP | 0442002 A1 | 2/1990 |
| EP | 2496052 A1 | 9/2012 |
| TW | 200402154 A | 2/2004 |
| TW | 200705719 A | 2/2007 |
| WO | 2006/131087 A1 | 12/2006 |
| WO | WO-2017175148 A1 * | 10/2017 |
| WO | 2019/079383 A1 | 4/2019 |

OTHER PUBLICATIONS

From the EPO as the ISA, Notification of Transmittal of the International Search Report and the Written Opinion of the International Searching Authority corresponding to PCT/IB2019/0013561, dated Sep. 20, 2020, 17 pages.

Cheng et al., GaN-based LEDs with Photonic Crystal Nanorod Sidewall Reflectors for Versatile Radiation Directionality Control, Lasers and Electro-Optics (CLEO), Laser Science to Photonic Applications—CLEO:2011—Laser Science to Photonic Applications, May 1-6, 2011, Baltimore, MD, USA, IEEE, US, pp. 1-2.

Yang, Hung-Pin D. et al., "InGaAs submonolayer quantum-dot photonic-crystal LEDs for fiber-optic communications", Microelectronics and Reliability, Elsevier Science Ltd., GB, vol. 50, No. 5, May 1, 2010, 4 pages.

* cited by examiner

HIGH BRIGHTNESS DIRECTIONAL DIRECT EMITTER WITH PHOTONIC FILTER OF ANGULAR MOMENTUM

CROSS-REFERENCE TO RELATED APPLICATIONS

This application claims priority to International Application No. PCT/IB2019/001351 filed on Dec. 20, 2019, which claims priority to European Patent Application 19156830.2 filed Feb. 13, 2019 and to U.S. patent application U.S. Ser. No. 16/230,760 filed Dec. 21, 2018, all of which are incorporated herein by reference in their entirety.

BACKGROUND

A typical light-emitting diode (LED) emitter generally produces a Lambertian radiation emission distribution pattern such that the radiation, when observed from an ideal diffuse radiator, is directly proportional to the cosine of the angle between the direction of the incident light and the surface normal. Secondary optics can be used to shape radiation so that it is more directional. Such optics can be bulky and may limit the benefits of the small form factor of the LED. Also, often times, the secondary optics can be lossy or simply not optimized for efficiency and, hence may end up absorbing a large portion of the emitted radiation.

SUMMARY

A nano-structure layer is disclosed. The nano-structure layer includes a plurality of nano-structure material that are configured in a first configuration such that light incident upon the nanostructured layer below a cut-off angle, with respect to normal, passes through the nanostructured layer and light incident upon the nanostructured layer above the cut-off angle is reflected back in direction of the incidence.

BRIEF DESCRIPTION OF THE DRAWINGS

A more detailed understanding can be had from the following description, given by way of example in conjunction with the accompanying drawings wherein.

DETAILED DESCRIPTION

Figure 1A:
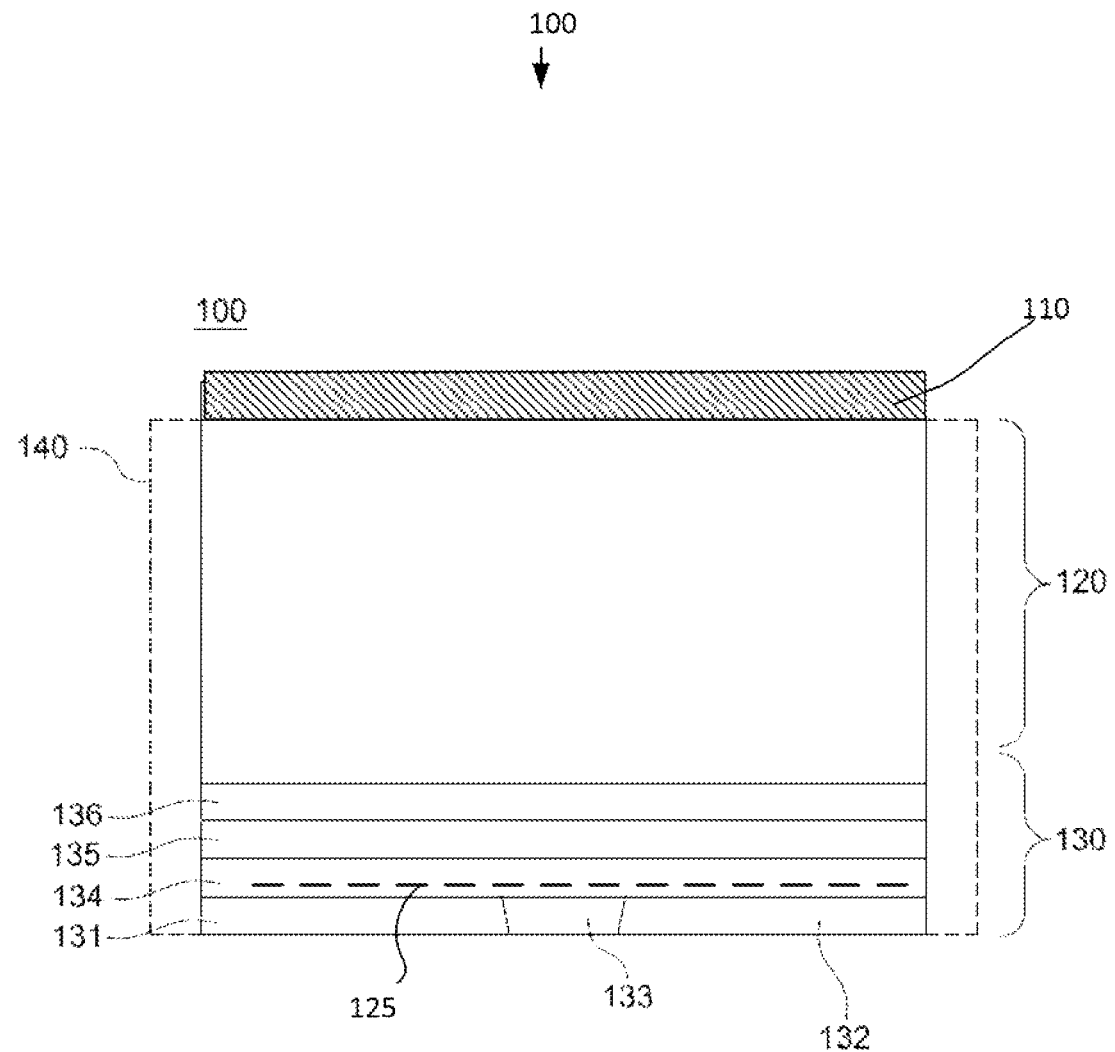
FIG. 1A is a diagram of light emitting device with a nano-structure layer.

Examples of different light illumination systems and/or light emitting diode implementations will be described more fully hereinafter with reference to the accompanying drawings. These examples are not mutually exclusive, and features found in one example may be combined with features found in one or more other examples to achieve additional implementations. Accordingly, it will be understood that the examples shown in the accompanying drawings are provided for illustrative purposes only and they are not intended to limit the disclosure in any way. Like numbers refer to like elements throughout.

It will be understood that, although the terms first, second, third, etc. may be used herein to describe various elements, these elements should not be limited by these terms. These terms may be used to distinguish one element from another. For example, a first element may be termed a second element and a second element may be termed a first element without departing from the scope of the present invention. As used herein, the term "and/or" may include any and all combinations of one or more of the associated listed items.

It will be understood that when an element such as a layer, region, or substrate is referred to as being "on" or extending "onto" another element, it may be directly on or extend directly onto the other element or intervening elements may also be present. In contrast, when an element is referred to as being "directly on" or extending "directly onto" another element, there may be no intervening elements present. It will also be understood that when an element is referred to as being "connected" or "coupled" to another element, it may be directly connected or coupled to the other element and/or connected or coupled to the other element via one or more intervening elements. In contrast, when an element is referred to as being "directly connected" or "directly coupled" to another element, there are no intervening elements present between the element and the other element. It will be understood that these terms are intended to encompass different orientations of the element in addition to any orientation depicted in the figures.

Relative terms such as "below," "above," "upper,", "lower," "horizontal" or "vertical" may be used herein to describe a relationship of one element, layer, or region to another element, layer, or region as illustrated in the figures. It will be understood that these terms are intended to encompass different orientations of the device in addition to the orientation depicted in the figures.

Semiconductor light emitting devices or optical power emitting devices, such as devices that emit ultraviolet (UV) or infrared (IR) optical power, are among the most efficient light sources currently available (hereinafter "LEDs"). These LEDs, may include light emitting diodes, resonant cavity light emitting diodes, vertical cavity laser diodes, edge emitting lasers, or the like. Due to their compact size and lower power requirements, for example, LEDs may be attractive candidates for many different applications. For example, they may be used as light sources (e.g., flash lights and camera flashes) for hand-held battery-powered devices, such as cameras and cell phones. They may also be used, for example, for automotive lighting, heads up display (HUD) lighting, horticultural lighting, street lighting, torch for video, general illumination (e.g., home, shop, office and studio lighting, theater/stage lighting and architectural lighting), augmented reality (AR) lighting, virtual reality (VR) lighting, as back lights for displays, and IR spectroscopy. A single LED may provide light that is less bright than an incandescent light source, and, therefore, multi junction devices or arrays of LEDs (such as monolithic LED arrays, micro LED arrays, etc.) may be used for applications where more brightness is desired or required.

LEDs that increase radiation within a narrow angular range via nanostructured layers are disclosed. The disclosed implementations may allow control over beam direction for normal or side emission. The disclosed implementations may be used for any direct emitter applications including, but not limited to infrared (IR) applications, single wavelength applications, or the like.

A nano-structure layer may include nano-structure material such as meta-surfaces, plasmonic nanostructures, meta-molecules, photonic crystals, among others. As used herein, photonic crystals and meta-surfaces may be periodic arrangements of meta-atoms and/or nano-antennae. A meta-atom nano-structure layer may include an array of meta-atoms. A nano-antenna nano-structure layer may include one or more nano-antennae. Nanostructured layers, as disclosed herein, may incorporate the design of LED devices with nano scale optical antennas placed on an LED surface (e.g., a sapphire substrate).

The design and optimization of controlling beam direction of LEDs is disclosed. By way of example and in order to provide concrete description, a flip chip of chip scale package (CSP) LED with a sapphire substrate is described, although the principles and teaching herein may be applied to any applicable LED design. A sapphire based CSP emitter with a smooth light escape surface (LES) may allow deposition of a nanostructured layer such that light emitted by an LED is incident upon the nanostructured layer via the sapphire substrate.

A nanostructured layer may transmit radiation within a limited angular range. The limited angular range may be one that renders a pre-determined angular radiation pattern in the far-field. As an example, an LED configured to increase brightness at normal (e.g., at 0 degrees, or, straight) to a light emitting surface, may be manufactured using a nanostructured layer as disclosed herein. To increase brightness at normal, a nanostructured layer may create an angular filter that transmits lights at angles lower than an angular cut-off angle and reflects radiation above the angular cut-off angle, as further disclosed herein. Light incident at an angle lower than the angular cut-off angle may be transmitted through the nanostructured layer and may be re-radiated into preferred cone angles (e.g., +/−5 deg, +/−45 deg, and +/−60 deg, etc.) as further disclosed herein.

The nanostructured layers disclosed herein may include nano-antennae placed in a pre-determined arrangement to re-radiate emission into preferential angular directions. The preferential angular direction based radiation may be a deviation from a Lambertian radiation emission such that it may be shaped by a nanostructured layer to re-radiate light into preferred cone angles. The nanostructured layers disclosed herein may utilize a partial band-gap to restrict the angular momentum range of radiation. The partial band-gap may be determined based on a configuration of the nanostructured layer(s) such that radiation is only allowed within a particular range of angles, for example, center to normal or near grazing (highly oblique radiation).

FIG. 1A illustrates an LED device 100 including a nanostructured layer 110 on top of an LED device that includes an epitaxial grown semiconductor layers 130 and substrate 120. The epitaxial grown semiconductor layers 130 may include a first contact 131 and a second contact 132 separated by a gap 133 which may be an airgap or may be filled with dielectric material. A p-type layer 134 may be proximate to an active layer 135 and an n-type layer 136. The active layer 135 may be configured to emit light distal from the contacts 131 and 132 such that light beams emitted from the active layer 135 are generally emitted towards the substrate 120. The LED device 100 is presented in a simplified form for ease of understanding of the invention, knowing that one possessing an ordinary skill in the pertinent arts would understand the other elements included within an LED.

The epitaxial grown semiconductor layers 130 may be formed from any applicable material configured to emit photons when excited including sapphire, SiC, GaN, Silicone and may more specifically be formed from a III-V semiconductors including, but not limited to, AlN, AlP, AlAs, AlSb, GaN, GaP, GaAs, GaSb, InN, InP, InAs, InSb, II-VI semiconductors including, but not limited to, ZnS, ZnSe, CdSe, CdTe, group IV semiconductors including, but not limited to Ge, Si, SiC, and mixtures or alloys thereof. These example materials may have indices of refraction ranging from about 2.4 to about 4.1 at the typical emission wavelengths of LEDs in which they are present.

For example, Aluminum nitride (AlN) may be used and is a wide band gap (6.01-6.05 eV at room temperature) material. AlN may have refractive indices of about 1.9-2.2 (e.g., 2.165 at 632.8 nm). III-Nitride semiconductors, such as GaN, may have refractive indices of about 2.4 at 500 nm, and III-Phosphide semiconductors, such as InGaP, may have refractive indices of about 3.7 at 600 nm. An example gallium nitride (GaN) layer may take the form of a layer of pGaN. As would be understood by those possessing an ordinary skill the pertinent arts, GaN is a binary III/V direct bandgap semiconductor commonly used in light-emitting diodes. GaN may have a crystal structure with a wide band gap of 3.4 eV that makes the material ideal for applications in optoelectronics, high-power and high-frequency devices. GaN can be doped with silicon (Si) or with oxygen to create an n-type GaN and with magnesium (Mg) to create a p-type GaN as is used in the present example. The active layer 135 is the region where light is emitted as electroluminescence occurs. Contacts 131 and/or 132 coupled to the LED device 100 may be formed from a solder, such as AuSn, AuGa, AuSi or SAC solders.

As shown in FIG. 1A, substrate 120 may be located between the semiconductor layers 130 and the nanostructured layer 110. The substrate may be a CSP emitter with a smooth LES that enables deposition of the nanostructured layer 110. The substrate 120 may comprise sapphire, which is an aluminum oxide (Al2O3) also known as corundum, and can exhibit properties including being very hard, strong, easy to machine flat, a good electrical insulator, and an excellent thermal conductor. Sapphire is generally transparent when produced synthetically with the blue color in naturally occurring sapphires (and the red in rubies, which are another form of corundum) coming from impurities in the crystal lattice. In other LEDs, the sapphire may be replaced with gallium nitride (GaN). The semiconductor layers 130 may be in the region where light is emitted as electroluminescence occurs.

As shown in FIG. 1A, the sidewalls of the substrate 120 may be covered by sidewall material 140. The sidewall material 140 may also cover one or more layers of the semiconductor layers 130 such that either the same sidewall material 140 covers the substrate 120 and the semiconductor layers 130 or a different material may cover the sidewalls of the substrate 120 than the semiconductor layers 130. The sidewall material 140 may be any applicable reflecting or scattering material. According to an embodiment, the sidewall material 140 may be a distributed Bragg reflector (DBR).

As disclosed herein, to emit light at a pre-determined angular radiation, such as to increase brightness at normal, a nanostructured layer may create an angular filter that transmits lights at angles lower than an angular cut-off angle, with respect to normal, and reflects radiation above the angular cut-off angle. Reflected radiation may reflect back into the substrate 120 such that beams of radiated light within the radiation are incident upon the sidewall material 140 and/or a back reflector 125 located below the active layer 135 and distal from the surface of the substrate 120 that faces the nanostructured layer 110. The back reflector 125 may be a plasmonic layer including planar metal mirrors, a distributed Bragg reflector (DBR) and/or other known LED reflectors. The back reflector is designed to reflect the light beams that are reflected back into the substrate 120. The back reflector 125 may reflect light beams before or after the light beams bounce off sidewall material 140 or may reflect light beams directly reflected by the nanostructured layer 110.

The nanostructured layer 110 may include photonic materials incorporated into photonic crystals and/or meta-surfaces which may include meta-atoms and/or nano-antennae such that the largest dimension for a meta-atom or nano-antennae is less than 1000 nm. The nano-antennae can be implemented as an array of nanoparticles located in the nano-structure layer, as further disclosed herein. The nano-antennas may be arranged in either periodic or a-periodic patterns. In analogy with chemical molecules composed of atoms, a meta-surface is composed of meta-atoms with the meta-atoms combined together and interacting to give the meta-surface unique optical properties. The size of individual meta-surfaces may be sub-wavelength or may be formed at the same order of wavelength of use.

The nanostructured layer 110 can also include nano-antennae that are distributed throughout a host dielectric medium. The sizes of the nano-antennae may be a sub-wavelength of order of wavelength.

The nanostructured layer 110 may be designed with a configuration so that its optical properties have a resonance or controllable properties at one or more wavelengths such that the configuration causes re-radiation of emitted light into a preferential angular direction (e.g., a desired cone angle of +/−5 deg, +/−45 deg and +/−60 deg, etc.). As a result, the nanostructured layer 110 behaves as an optical antenna and may radiate the light incident upon the nano-structure layer through into free space such that the light satisfies certain emission conditions. This may be achieved by tuning the structure and chemical composition of the nano-structure layer 110 so as to simultaneously excite electric and magnetic dipoles, quadrupoles and higher order multipoles within the nano-structure layer 110. The simultaneous excitation of the dipoles and higher order multipoles may tailor the emission properties of the nano-structure layer 110 to steer angular radiation such that light emitted by the LED device 100 is boosted within a given restricted angular range.

Tailoring of the configuration of the photonic crystals and/or meta-surfaces in the nano-structure layer 110 enables transmission of radiation incident upon the substrate within a limited angular range. Control of the angular emission patter (or directivity) may be accomplished by either one or both of re-radiating emission into a preferred angular direction (e.g., via beam bending) or by restricting the angular momentum range of radiation (e.g., filtering incident light beams based on their angle of incident).

Figure 1B:
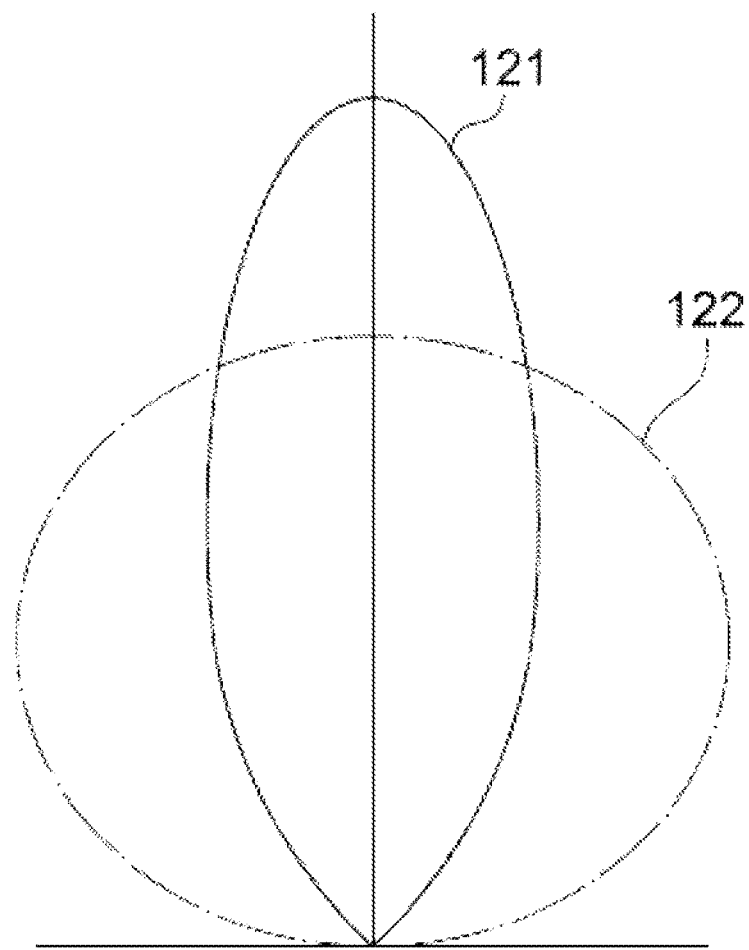
FIG. 1B is a graph showing a Lambertian radiation emission versus a desired radiation emission distribution pattern.

A nano-structure layer 110 may include nano-antennae arranged in an array. The nano-antennae may be configured such that they re-radiate emission into preferential angular directions. A partial band-gap may be engineered to restrict the angular momentum range of radiation such that radiation is only allowed within a particular range, for example, centered at or about normal. FIG. 1B shows an angular range centered at 0 in the X direction and transmission in the Y direction. As shown in FIG. 1B, an example Lambertian radiation emission distribution pattern 122 has a lower but wider transmission range when compared to a desired radiation emission distribution pattern 121, provided in accordance with the subject matter disclosed herein with the use of a nanostructured layer. As shown, the desired radiation emission distribution pattern 121 shows radiation within a narrow angular range with a higher transmission value within the narrower angular range.

Figure 1C:
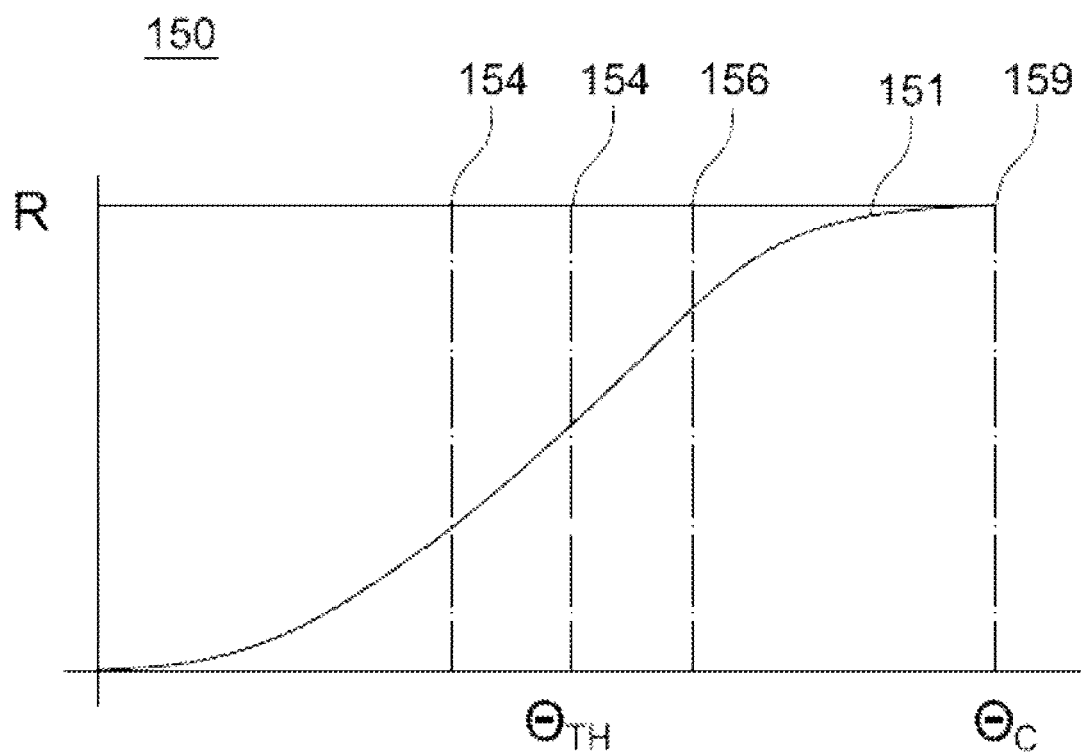
FIG. 1C is graph showing reflectance as a function of angle.

FIG. 1C shows a graph with a Y axis of reflectivity and an X axis of an angle of incidence of light 151 incident upon a nanostructured layer 110 of FIG. 1A. As shown, light incident upon the nano-structure layer 110 at angles closer to normal (e.g., closer to 0 degrees) have a reflectivity of near zero such that all light incident at such angles passes through the nano-structure layer 110 without any or a minimal amount of light being reflected back into the substrate 120. As shown in FIG. 1C, the amount of reflectance may increase as the angle of incidence increases such that the $\Theta_c$ 159 represents a cut-off angle where all light at or past the cut-off angle, with respect to normal, is reflected back into a substrate (e.g., substrate 120). At angle $\Theta_{TH}$, half of light incident upon the nano-structure layer 110 may be reflected, at 154, less than half the light may be reflected, and at 156, more than half the light is reflected.

Figure 1D:
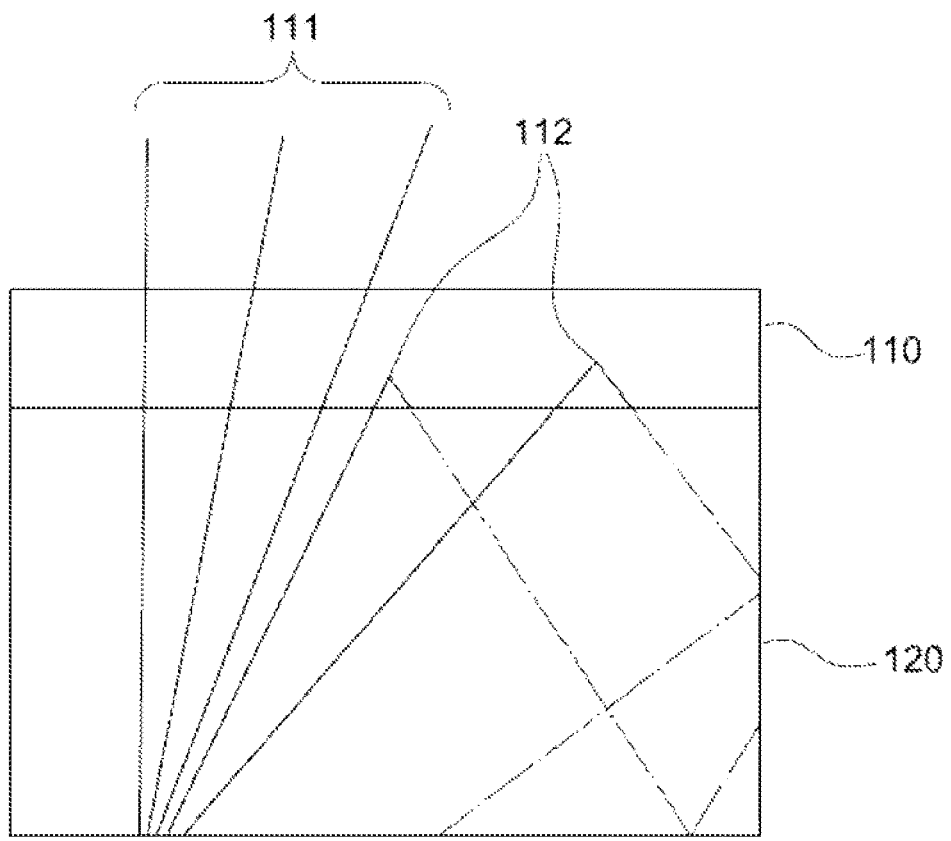
FIG. 1D is a diagram showing light beams at different angles.

An example visual representation of this phenomenon is shown in FIG. 1D by light beams 111 and 112. Light beams 111 and 112 may traverse the substrate 120 to the nano-structure layer 110. Light beams 111 with an angle of incidence below a cut off angle (i.e., closer to normal) traverse through the and out of the nano-structure layer 110 and light beams 112 with an angle of incident higher than a cut off angle (i.e., further away from normal) are reflected back into the substrate 120. As disclosed herein, light beams reflected back into the substrate 120 may experience one or more bounces within the substrate and/or on a back reflector such that they may be incident upon the nano-structure layer 110 a second time after being reflected into the substrate 120 by the nano-structure layer 110. A light beam that is reflected into the substrate by the nano-structure layer 110 at a first time may experience one or more bounces within the substrate (e.g., at the sidewall material, back reflector, etc.) and may be incident upon the nano-structure layer 110 at a second time after the first time. The angle of incidence of the light beam, at the second time, may be lower than the cut off angle, with respect to normal, and accordingly, the light beam may pass through the nano-structure layer 110.

Figure 1E:
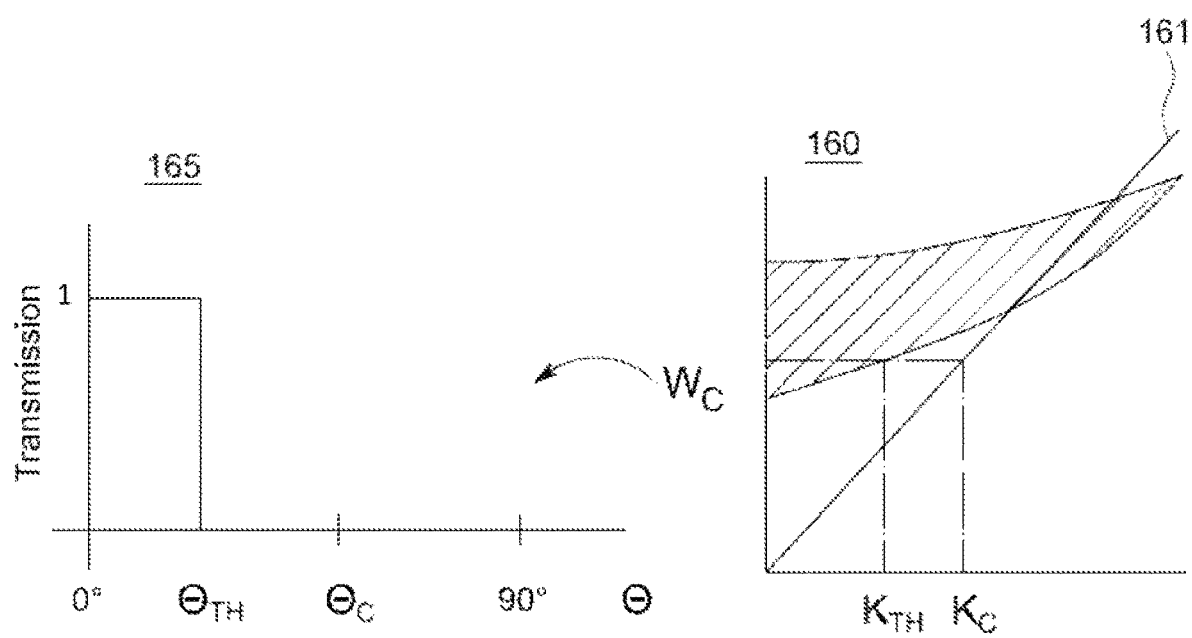
FIG. 1E is two graphs showing transmission based on angular frequency.
Figure 1F:
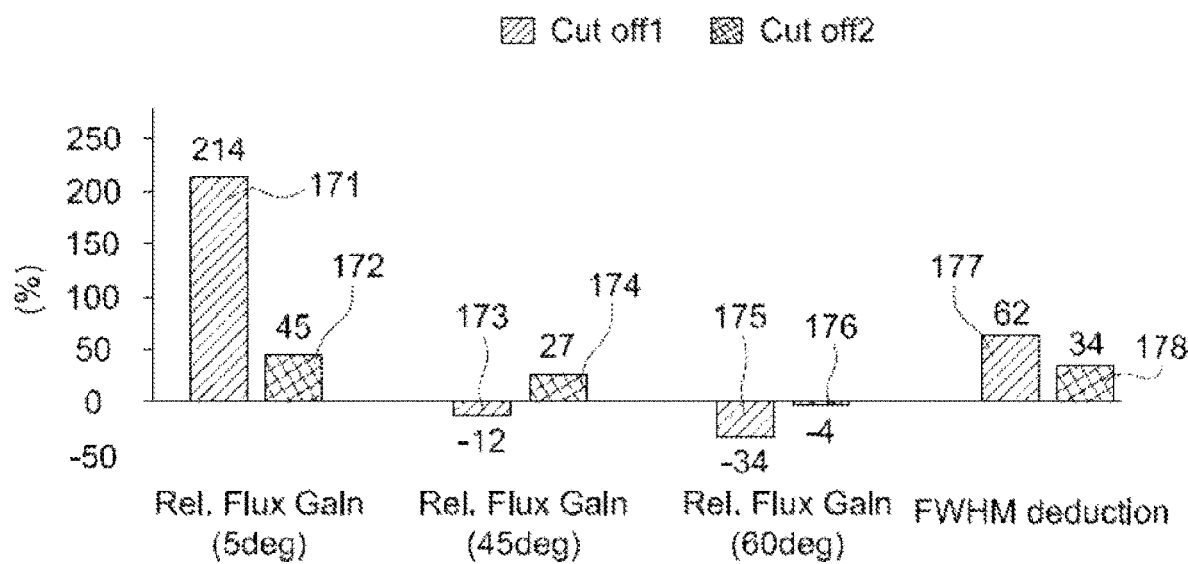
FIG. 1F is a chart showing relative flux gains over cone angles based on cut-off angles.
Figure 1G:
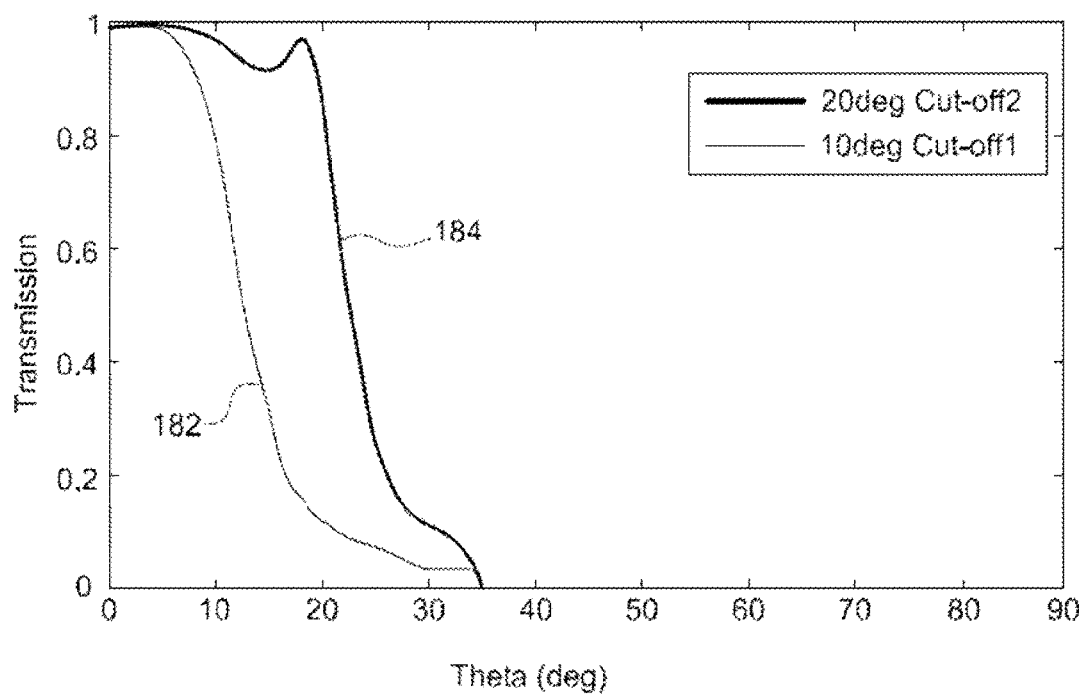
FIG. 1G is a chart showing transmission as a function of angle.
Figure 1H:
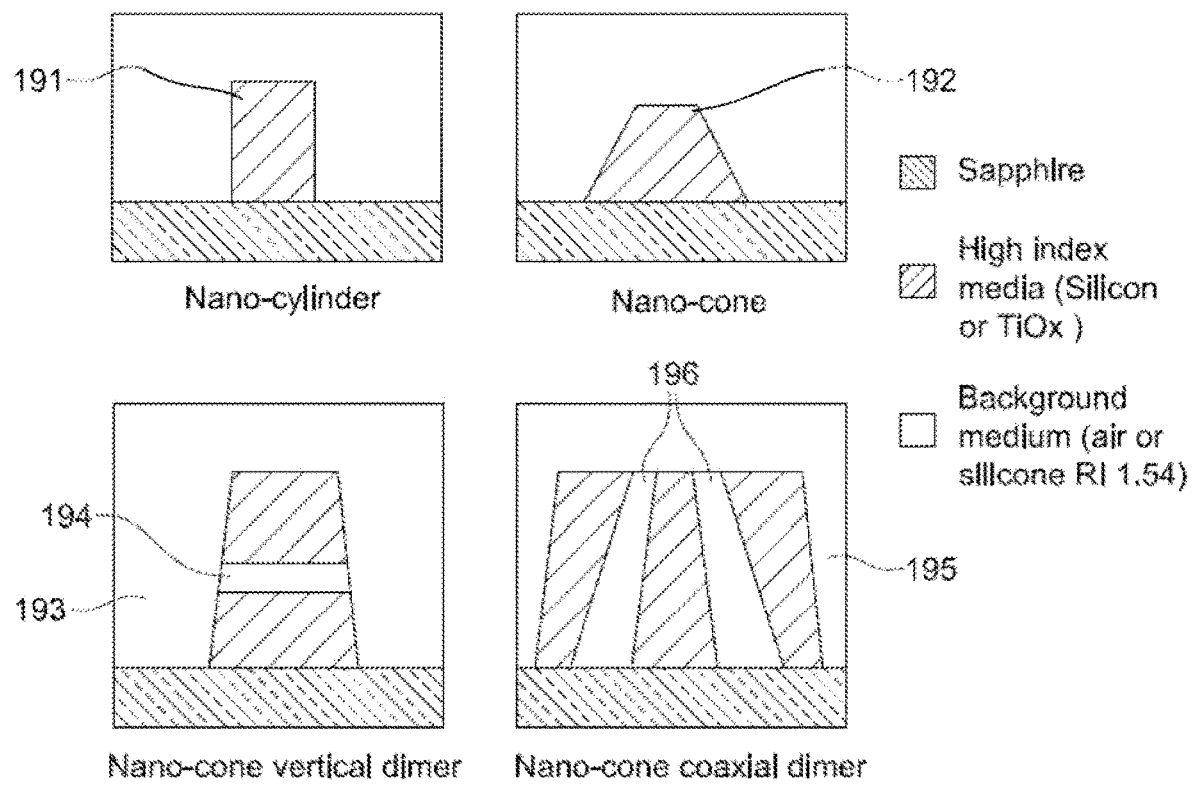
FIG. 1H shows example nano-antennae.
Figure 1I:
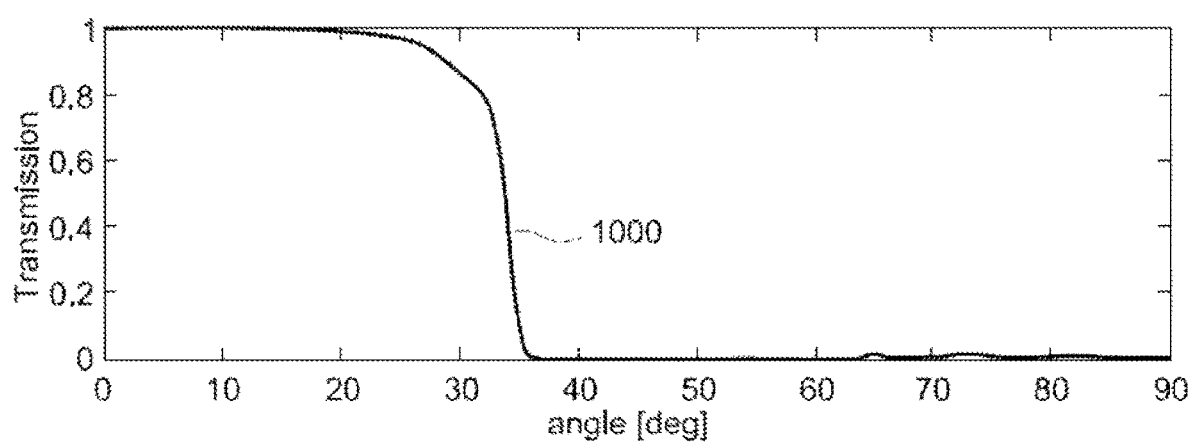
FIG. 1I is a graph showing transmission based on angle of incidence.
Figure 1J:
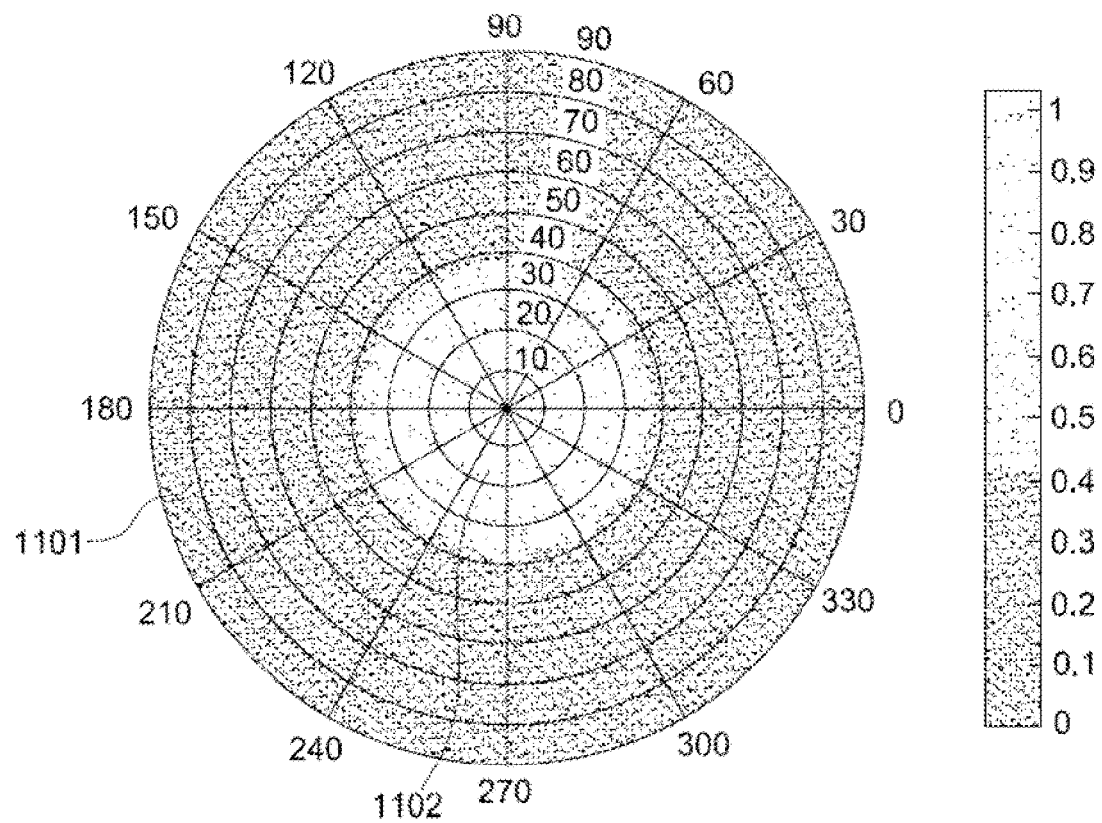
FIG. 1J is a transmission angular map for scattering.
Figure 1K:
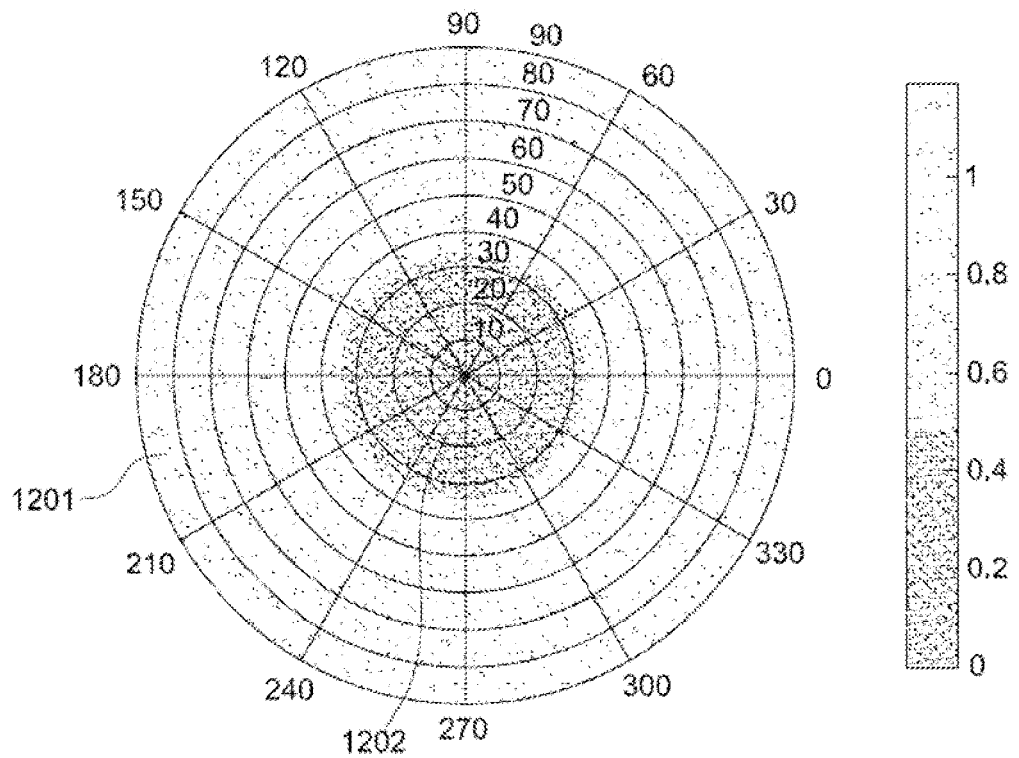
FIG. 1K is a reflectance angular map.
Figure 1L:
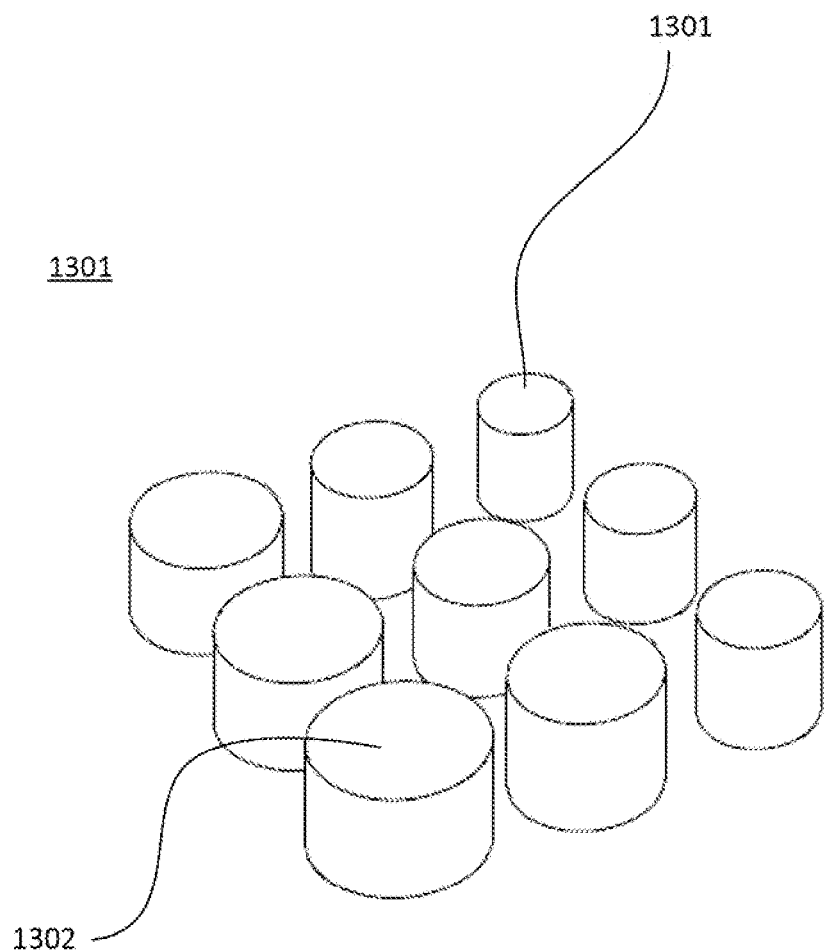
FIG. 1L is a multi nano-structure material array.
Figure 1M:
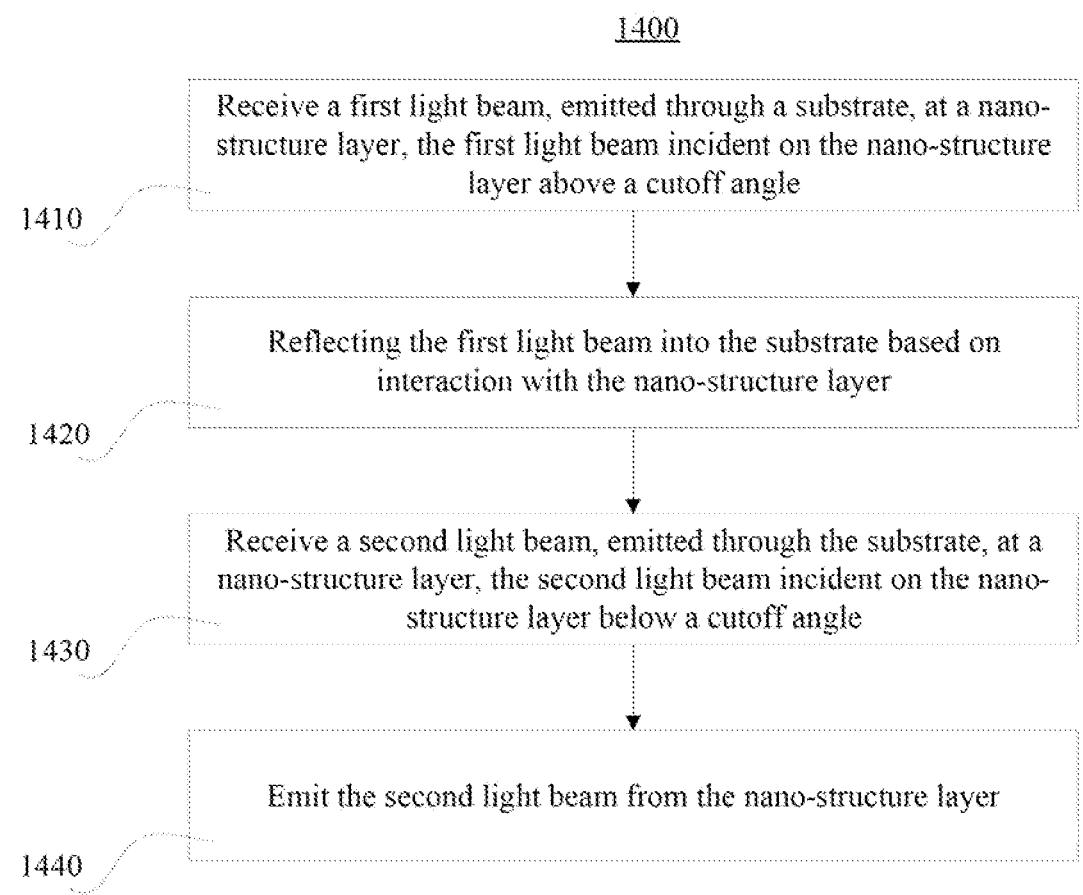
FIG. 1M is a flow diagram for light emission through a nano-structure layer.

FIG. 1M shows an example process 1400 of a beam transmission through substrate 120 and nano-structure layer 110. At step 1410, a first light beam may be incident upon the nano-structure layer 110 after traversing through substrate 120. The first light beam may be incident at an angle above the nano-structure layer 110's cut-off angle. At step 1420, the first light beam may be reflected back into the substrate 120 based on the interaction with the nano-structure layer 110 at an angle above the cut-off angle, with respect to normal. At step 1430, a second light beam may be incident upon the nano-structure layer 110 through the substrate 120. The second light beam may be incident at an angle below the nano-structure layer 110's cut-off angle, with respect to normal. At step 1440, the second light beam may be emitted through the nano-structure layer 110 based on its interaction with the nano-structure layer 110 at an angle below the cut-off angle, with respect to normal. According to an embodiment, as discussed herein, the first light beam may bounce off one or more inside surfaces of the substrate, sidewall material and/or back reflector and may be incident upon the nano-structure layer 110 at an angle below the cut-off angle. The first light beam may then be emitted through the nano-structure layer 110 based on the angle of incident below the cut-off angle.

FIG. 1E shows charts 165 and 160 corresponding to the behavior of light when incident upon the nano-structure layer 110. In chart 160, W represents the angular frequency and K represents the in plane angular moment. Light line 161 of chart 160 is determined based on the configuration of nano-structure layer 110 and represents the boundary between light that can pass through the nano-structure layer 110 and light that does not pass through nano-structure layer 110. Further, limiting light below a given angular frequency W allows an LED to achieve the desired radiation emission distribution pattern 121 of FIG. 1B. As shown in chart 165, the transmission output of light incident upon nano-structure layer 110 is unity below $\Theta_{TH}$ and drops to zero after $\Theta_{TH}$ as a result of reaching the corresponding angular cut-off Kth shown in FIG. 160. Accordingly, light emitted at K>Kth will pass through the nano-structure layer 110.

FIG. 1F shows a relative gain in flux, by percentage, represented via the Y axis, for various cone angles (5, 45, and 60 degrees) as well as full width at half maximum (FWHM) reduction. As shown, in this example, cut-off 1 represents a cut-off angle of 10 degrees and cut-off 2 represents a cut off angle of 20 degrees. The experimental results shown in FIG. 1F are obtained by using a 1 mm$^2$ CSP Gen 4 die with an AIN epi with sidewall material. As shown, the relative flux gain for a nano-structure layer 110 configured to emit a 5 degree cone angle was 214% for the 10 degree cut-off 171 and 45% for the 20 degree cut-off 172. The relative flux gain for a nano-structure layer 110 configured to emit a 45 degree cone angle was −12% for the 10 degree cut-off 173 and 27% for the 20 degree cut-off 174. The relative flux gain for a nano-structure layer 110 configured to emit a 60 degree cone angle was −34% for the 10 degree cut-off 175 and −4% for the 20 degree cut-off 176. As shown, light emitted at a wider cone angle but with narrow cut off experiences lower gain in flux. As also shown in FIG. 1F, the FWHM experienced at cut-off 1 177 is 62% and at cut-off 2 178 is 34%.

FIG. 1G shows transmission properties based on angle for the nano-structure layer 110 considered for simulation of the results provided in FIG. 1F. As shown, 182 represents the 10 degree cut-off configuration of the nano-structure layer 110 and 184 represents the 20 degree cut-off configuration of the nano-structure layer 110. As represent by the 10 degree cut-off of 182, the transmission is at unity until approximately 10 degrees when the transmission amount significantly drops as a gradient to less than 10% of its peak value by 20 degrees and drops to 0% of its peak value by 35 degrees. Similarly, as represented by the 20 degree cut-off of 184, the transmission is at unity until approximately 20 degrees when the transmission amount significantly drops as a gradient to less than 10% of its peak value by 30 degrees and drops to 0% of its peak value by 35 degrees.

Photonic crystals and/or meta-surfaces in the nano-structure layer 110 may be configured with a spatial gradient of phase. FIG. 1H illustrates various cross-sections of some different possible nano-antennae. The nano-antenna may be formed from nano-cylinders 191, nano-cones 192, or nano-cone 193 and 195 with vertical or coaxial dimmers, arranged in either hexagonal or rectangular lattice. The lattice period may be sub-wavelength or larger than wavelength. The nano-antennae may be Huygen's meta-atoms or support waveguide modes. A Huygen's nano-structure layer with spatial variation of radius can also be used to achieve the desired narrowing of the beam. Each photonic crystal or meta-surface may present a certain amount of beam bending properties such that incident beams can be shaped to the required angular distribution. In the cases of the nano-cylinder vertical dimer 194 in nano-cone 193 and coaxial dimer 196 in nano-cone 195, interfering modes within the meta-atom or nano-antenna provide additional control of the light emitted through nano-structure layer 110, using structural parameters. For example, the nano-antennae may be configured in an arrangement that establishes a given cut-off angle such that light incident below the cut-off angle passes through the nano-antennae, and thus the nano-structure layer, and light incident above the cut-off angle does not pass or is reflected back. Alternatively or in addition, the nano-antennae may be configured in an arrangement that results in a given cone angle (e.g., +/−5 deg, +/−45 deg, and +/−60 deg, etc.) based distribution. The cut-off angle and the cone angle based distribution may determine the overall flux gain experienced by light emitted though the nano-structure layer 110.

Nano-antennae may be formed or arrayed as single nano-structure material such that the same nano-antenna is repeated numerous times to form a nanostructured layer. Alternatively or in addition, nano-antennae may be formed or arrayed as multi nano-structure materials such that an array of nano-antennae is repeated numerous times to form a nanostructured layer. FIG. 1L illustrates an example multi nano-structure material 1300. As shown, the multi nano-structure material 1300 includes nano-cylinders 1301 and 1302 such that the different nano-cylinders 1301 and 1302 have one or more different properties when compared to each other. As a visual example, as shown in FIG. 1L, nano-cylinder 1301 is smaller in volume than the nano-cylinder 1302. This multi nano-structure material may be arrayed such that a nano-structure layer 110 includes multiple iterations of multi nano-structure material 1300. Each small multi nano-structure material 1300 of a nano-structure layer 110 may provide beam bending to the light incident on nano-structure layer 110. By suitably placing a multitude of different nano-cylinders 1301, with different beam bending properties, within a multi nano-structure material 1300 within nano-structure layer 110, light incident upon nano-structure layer 110 may be shaped to a predetermined or preferred angular distribution. The design and placement within nano-structure layer 110 may selected by an optimizer to obtain the best possible flux from the LED device 100 of FIG. 1A. The design of photonic crystals and/or meta-surfaces may be dictated by the required angular distribution and the placement of the same can be determined based on an optimizer to obtain the optimal transmission over the required angular distribution.

As disclosed herein, as the nano-structure layer 110 functions as an optical antenna, the directivity of the emitted light may be tuned by tuning the configuration of the photonic crystals and/or meta-surfaces in the nano-structure layer 110. The photonic crystals and/or meta-surfaces may be designed to provide collimated or un-collimated light emission from the LED at multiple wavelengths, beam-forming of light emitted for different wavelengths, or the like. To clarify, the shape of a light beam emitted from the nano-structure layer 110 is determined by the interference of the beam scattered by the individual photonic crystals and/or meta-atoms in the nano-structure layer 110 and from further interaction with neighboring nano photonic crystals and/or meta-surfaces in the nano-structure layer 110.

The simultaneous excitation of electric and magnetic dipoles in the nano-structure layer 110 may be sufficient to suppress back-scattering of light back into LED die and, thus yielding a large forward scatter. Such a nano-structure layer 110 may be built using purely dielectric nanoparticles, without using metals, thereby reducing absorption losses.

Photonic crystals and/or meta-surfaces in the nano-structure layer 110 may be purely plasmonic, composed of metal nanoparticles, or metallo-dielectric, composed of metals and dielectric nanoparticles, or purely dielectric, composed of dielectric nanoparticles, typically high index dielectrics. The photonic crystals and/or meta-surfaces in the nano-structure layer 110 may be fabricated using top-down or bottom-up fabrication methods and may utilize nanoparticle self-assembly to provide advantages for manufacturing and scalability. Photonic crystals can be fabricated for one, two, or three dimensions. One-dimensional photonic crystals can be made of layers deposited or stuck together. Two-dimensional ones can be made by photolithography, or by drilling holes in a suitable substrate. Fabrication methods for three-dimensional ones include drilling under different angles, stacking multiple 2D layers on top of each other, direct laser writing, or, for example, instigating self-assembly of spheres in a matrix and dissolving the spheres. The meta-atoms within photonic crystals and/or meta-surfaces in the nano-structure layer 110 may be held together by different techniques including, but not limited to, molecular linkers, DNA, and the like. Alternatively, they may be fabricated by top-down fabrication techniques, such as nano-imprint lithography, nano-sphere lithography, or the like, and individual meta-atom released using lift-off techniques. A nano-structure layer may be encapsulated by dielectrics such as silicon dioxide or aluminum dioxide to prevent degradation of meta-atom properties over time.

FIG. 1I shows the phi averaged transmission 1000 versus angle plot for a nano-structure layer, with TiOx nano-cylinders, the plot obtained at 450 nm. As shown, the configuration of the nano-structure layer 110 enables a unity or near unity transmission until a cut-off angle of approximately 35 degrees and does not permit transmission after the cut-off angle.

FIG. 1J shows a transmission angular map for scattering by the TiOx nano-cylinder based nano-structure layer of FIG. 1I. The angular map is generated for such a nano-structure layer on sapphire substrate in a background medium of air at 450 nm. The pitch of the hexagonal lattice used was 200 nm, the height of the rod was 250 nm and the radius was 56 nm. It should be noted that similar results may be obtained for a silicon nano-rod at 840 nm with a height of 150 nm.

FIG. 1K shows a reflection angular map for scattering by the TiOx nano-cylinder based nano-structure layer of FIG. 1I. The angular map is generated for such a nano-structure layer on sapphire substrate in a background medium of air at 450 nm. The pitch of the hexagonal lattice used was 200 nm, the height of the rod was 250 nm and the radius was 56 nm. It should be noted that similar results may be obtained for a silicon nano-rod at 840 nm with a height of 150 nm.

Referring again to FIG. 1A, side reflectors 140, back reflector 125, or side reflectors 140 and back reflector 125 may be non-specularly reflective nanostructured layers designed to further enhance directional light output through nanostructured layer 110.

For example, side reflectors 140 may be nanostructured layers designed such that light incident on them at low angles of incidence (e.g., normal or near normal) is reflected at a large oblique angle of reflection toward nanostructured layer 110 at an angle of incidence on nanostructured layer 110 within the cut-off angle for transmission through nanostructured layer. As another example, back reflector 125 may be a nanostructured layer designed such that light incident on it at large oblique angles is reflected at a low angle of reflection toward nanostructured layer 110 at an angle of incidence on nanostructured layer 110 within the cut-off angle for transmission through nanostructured layer 110. Side reflectors 140 as just described may be used in combination with rear reflectors 125 as just described.

Side reflectors 140 and back reflectors 125 as just described may take the form of a nanostructured photonic layer designed to steer angular radiation. Such a nanostructured side or back reflector may include or consist of a photonic crystal, metamaterial, metasurface or subwavelength gratings of asymmetric scattering elements (scattering elements are also referred to herein as nanoantennas), by way of non-limiting example only. The main function of such a nanostructured side or back reflector is to reflect radiation incident upon it from a given angular range to a chosen angular range. This restricted angular range may be chosen to direct as much light as possible from the rear surface or sides of the LED toward nanostructured layer 110 at angles of incidence within the cut-off angle for transmission through nanostructured layer 110.

Such a nanostructured back or side reflector may comprise scattering elements formed into, or arrayed, into unit cells. Each unit cell may provide beam bending to the light incident on the side reflector. By suitably arranging a multitude of different unit cells with different beam bending properties, the light may be shaped to the required angular distribution.

In such a nanostructured side or back reflector the reflective beam-benders (unit cells) may arranged in a periodic two-dimensional pattern or grating, for example, and may be formed of background material encapsulating or otherwise containing one or more scattering elements and positioned adjacent to substrate 120. The plurality of scattering elements may be surrounded by the background material. A specular reflector may be adjacent to the background material distal to substrate 120. Asymmetrical scattering may be achieved, for example, by using asymmetric scattering elements designed to link the reflected fields from the specular reflector to the scattered fields from scattering elements. Interference between these fields causes light to be scattered in a particular direction. The arrangement of scattering elements may produce a spatial gradient of phase.

A unit cell for a periodic array of beam benders in a nanostructured side reflector may be rectangular in dimensions and include a series of layers including a specular reflector, one or more scattering elements, and background material as described above. Periodicity may be centered on a wavelength in use, such as for example the peak wavelength emitted by the LED (e.g., 450 nm). In the unit cell, one or more scattering elements may be positioned adjacent to substrate layer 120 distal to the specular reflector and/or one or more scattering elements may be places in contact, or near contact, with the specular reflector.

The scattering elements may be of any suitable height and width and may be formed, for example, from silicon (Si) or titanium oxide (TiO$_2$), or a combination thereof. The background material may be a low refractive index material, such as magnesium fluoride (MgF$_2$), for example. The specular reflector, if present, may be a metal mirror, for example a gold or silver mirror, a dielectric mirror, or a Bragg reflector, for example.

The scattering elements may take the form of any of the scattering elements described herein. A scattering element may comprise a single light scatterer (a single dipole), or an array of light scatterers (dipoles) that may be configured analogously to a yagi-uda antenna, for example.

A scattering element may be designed as two interfering Huygen's meta-atoms. The scattering elements may be selected to satisfy the first Kerker's conditions so that the magnetic and electric dipole radiation cancel in the backward direction yielding a large forward scatter, referred to as Huygen's meta-atoms. A scattering element may be formed as a two-dimensional scatterer, such as a grating, for example, or a three-dimensional scatter. An example three-dimensional scatter may be a nano-cylinder. Other geometrical scatterers may also be employed includes L-shaped scatterers, for example.

The scattering elements may be formed, for example, from nano-cylinders, nano-cones, or nano-cuboids arranged for example in either a hexagonal or a rectangular lattice. The lattice period may be sub-wavelength or larger than wavelength. In the cases of a nano-cylinder vertical dimer and coaxial dimer, interfering modes within the meta-atom or nano-antenna provide additional control of the scattered modes using structural parameters.

The scattering elements may also be formed from photonic metamaterial (PM), also known as an optical metamaterial, which is a type of electromagnetic metamaterial that interacts with light, covering terahertz (THz), infrared (IR) or visible wavelengths. The materials employ a periodic, cellular structure. The subwavelength periodicity distinguishes photonic metamaterials from photonic band gap or photonic crystal structures. The cells are on a scale that is magnitudes larger than atoms, yet much smaller than the radiated wavelength, and are on the order of nanometers. In metamaterials, cells take the role of atoms in a material that is homogeneous at scales larger than the cells, yielding an effective medium model.

Figure 2A:
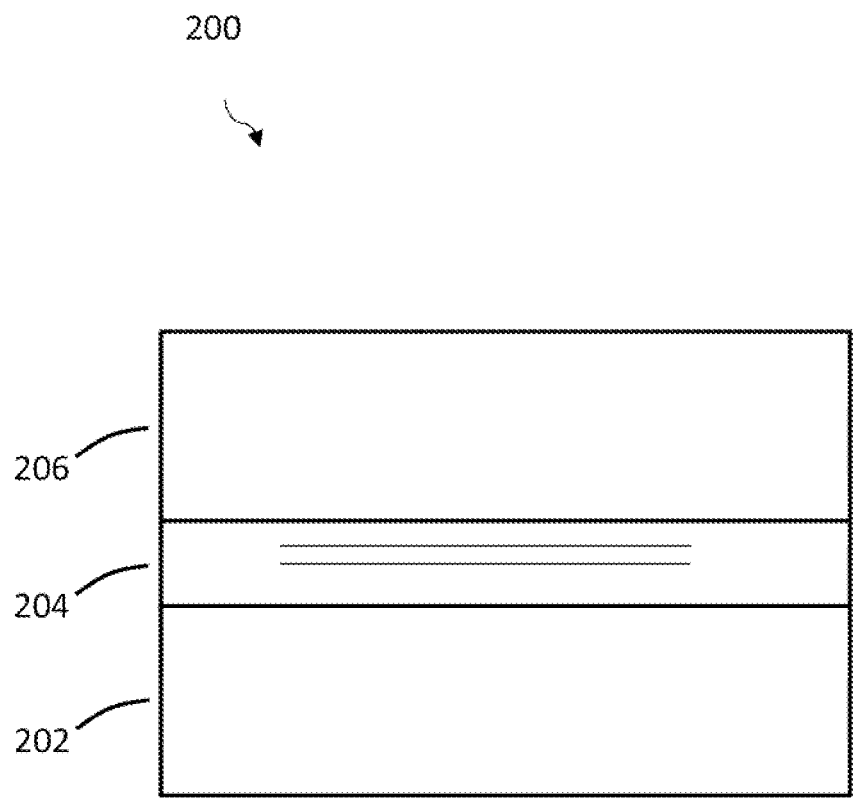
FIG. 2A is a diagram showing an Light Emitting Diode (LED) device.

FIG. 2A is a diagram of an LED device 200 in an example embodiment. The LED device 200 may include one or more epitaxial layers 202, an active layer 204, and a substrate 206. In other embodiments, an LED device may include a wavelength converter layer and/or primary optics. As shown in FIG. 2A, the active layer 204 may be adjacent to the substrate 206 and emit light when excited. The epitaxial layers 202 may be proximal to the active layer 204 and/or one or more intermediate layers may be between the active layer 204 and epitaxial layers 202. The substrate 206 may be proximal to the active layer 204 and/or one or more intermediate layers may be between the active layer 204 and substrate 206. The active layer 204 emits light into the substrate 206.

Figure 2B:
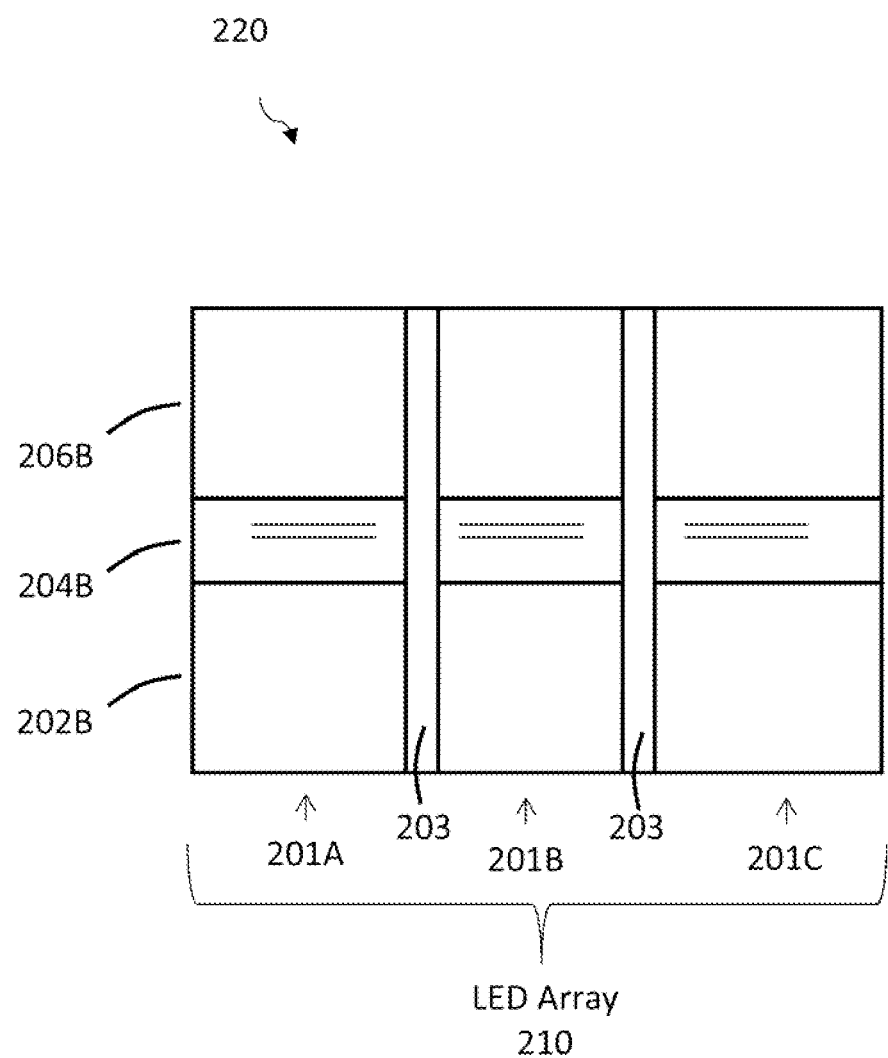
FIG. 2B is a diagram showing multiple LED devices.

FIG. 2B shows a cross-sectional view of a lighting system 220 including an LED array 210 with pixels 201A, 201B, and 201C. The LED array 210 includes pixels 201A, 201B, and 201C each including a respective substrate 206B active layer 204B and an epitaxial layer 202B. Pixels 201A, 201B, and 201C, in the LED array 210 may be formed using array segmentation, or alternatively using pick and place techniques and may, for example, emit light at different peak wavelengths such as red, green, and blue. The spaces 203 shown between one or more pixels 201A, 201B, and 201C may include an air gap or may be filled by a material such as a metal material which may be a contact (e.g., n-contact). According to some embodiments, secondary optics such as one or more lenses and/or one or more waveguides may be provided.

Figure 3:
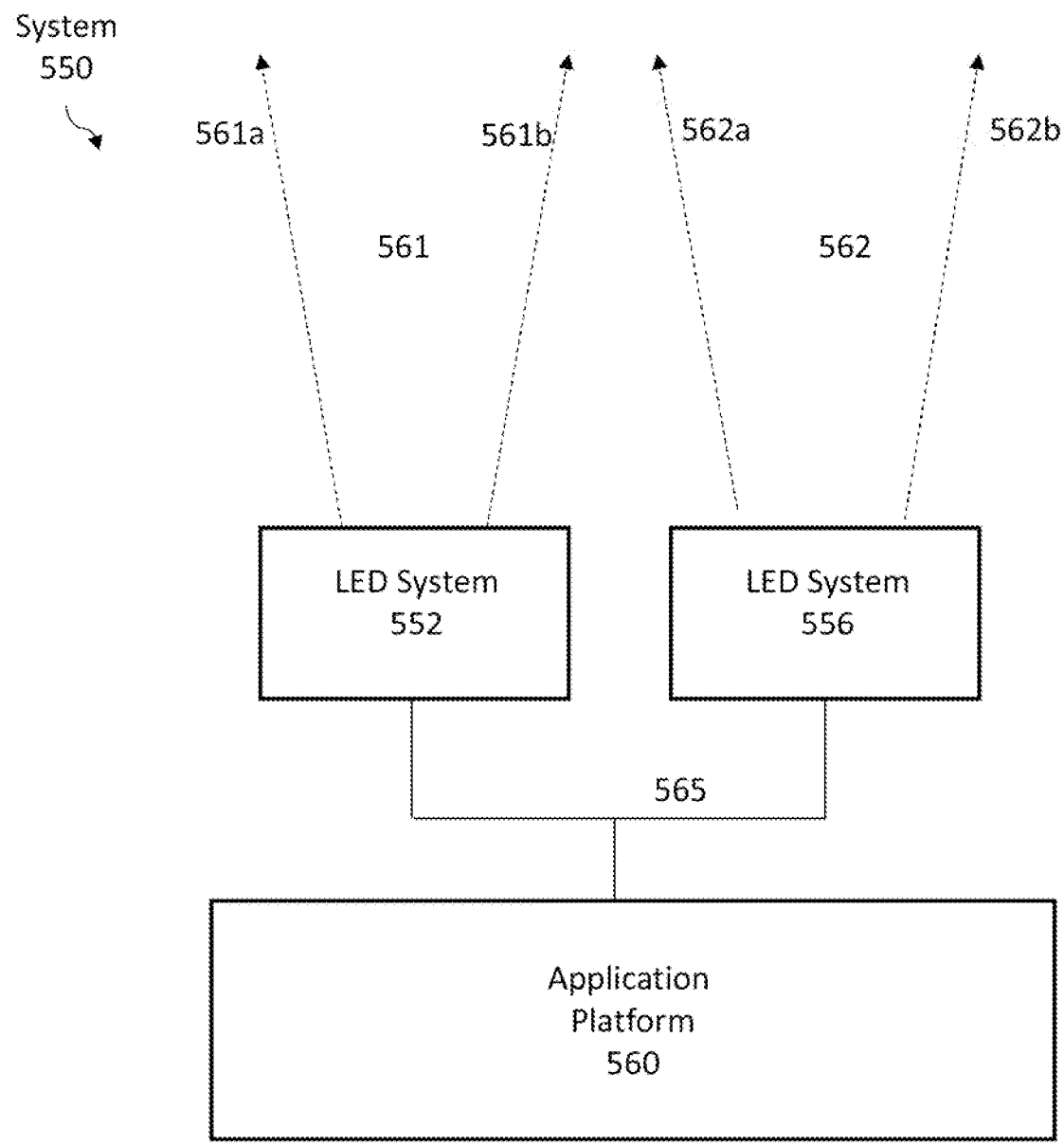
FIG. 3 is a diagram of an example application system.

The LED device 200 or pixels 201A, 201B, and 201C may be single wavelength emitters and may be powered individually or via as an array. The LED device 200 or pixels 201A, 201B, and 201C may be part of an illumination system that includes one or more electronics boards, power modules, sensors, connectivity and control modules, LED attach regions, or the like. Pixels in an array may be powered based on different channel signals and their operation may be determined by a microcontroller. The pixels 201A, 201B, and 201C may be manufactured in accordance with the subject matter disclosed herein such that they may have respective nano-structure layers 210A, 210B, and 210C FIG. 3 shows an example system 550 which includes an application platform 560 and LED systems 552 and 556. The LED system 552 produces light beams 561 shown between arrows 561a and 561b. The LED system 556 may produce light beams 562 between arrows 562a and 562b. As an example embodiment, the LED system 552 and 556 may be part of an automobile and may emit infrared (IR) light communication beams such that an oncoming vehicle in the path of the light beams 561 and/or 562 is able to receive communication from the automobile. In example embodiments, the system 550 may be a mobile phone of a camera flash system, indoor residential or commercial lighting, outdoor light such as street lighting, an automobile, a medical device, AR/VR devices, and robotic devices.

The application platform 560 may provide power to the LED systems 552 and/or 556 via a power bus via line 565 or other applicable input, as discussed herein. Further, application platform 560 may provide input signals via line 565 for the operation of the LED system 552 and LED system 556, which input may be based on a user input/preference, a sensed reading, a pre-programmed or autonomously determined output, or the like. One or more sensors may be internal or external to the housing of the application platform 560.

In various embodiments, application platform 560 sensors and/or LED system 552 and/or 556 sensors may collect data such as visual data (e.g., LIDAR data, IR data, data collected via a camera, etc.), audio data, distance based data, movement data, environmental data, or the like or a combination thereof. The data may be collected based on emitting an optical signal by, for example, LED system 552 and/or 556, such as an IR signal and collecting data based on the emitted optical signal. The data may be collected by a different component than the component that emits the optical signal for the data collection. Continuing the example, sensing equipment may be located on an automobile and may emit a beam using a vertical-cavity surface-emitting laser (VCSEL). The one or more sensors may sense a response to the emitted beam or any other applicable input.

Although features and elements are described above in particular combinations, one of ordinary skill in the art will appreciate that each feature or element can be used alone or in any combination with or without the other features and elements. In addition, the methods described herein may be implemented in a computer program, software, or firmware incorporated in a computer-readable medium for execution by a computer or processor. Examples of computer-readable media include electronic signals (transmitted over wired or wireless connections) and computer-readable storage media. Examples of computer-readable storage media include, but are not limited to, a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

What is claimed is:

1. A light emitting device comprising:
a semiconductor diode structure;
a substrate transparent to light emitted by the semiconductor diode structure and comprising a top surface, an oppositely positioned bottom surface, and side surfaces connecting the top and bottom surfaces, the bottom surface disposed on or adjacent the semiconductor diode structure; and
an angular filter comprising photonic crystals, disposed on or adjacent the top surface of the substrate, and arranged to transmit light emitted by the semiconductor diode structure into the substrate and incident on the angular filter at an angle of incidence less than a cut-off angle and reflect back into the transparent substrate light emitted by the semiconductor diode structure and incident on the angular filter at an angle of incidence greater than or equal to the cut-off angle, such that transmission through the angular filter of light at angle of incidence 35 degrees and higher is 0%,
a reflective nanostructured layer disposed on or adjacent to a side surface of the substrate and configured to reflect toward the angular filter, at an angle of incidence less than the cutoff angle, light emitted by the semiconductor diode structure into the substrate that is incident on the reflective nanostructured layer at perpendicular or near perpendicular incidence, the reflective nanostructured layer comprising a specular reflector, a dielectric layer disposed between the specular reflector and the substrate, and a periodic arrangement of nano-antennas disposed between the specular reflector and the substrate and spaced apart from the specular reflector by the dielectric layer.

2. The light emitting device of claim 1, wherein the cut-off angle is less than or equal to 10 degrees.

3. The light emitting device of claim 1, wherein the cut-off angle is less than or equal to 20 degrees.

4. The light emitting device of claim 1, wherein light emitted by the semiconductor diode structure into the transparent substrate and incident on the angular filter at an angle of incidence less than the cut-off angle is transmitted through the angular filter within a cone angle of +/−60 degrees.

5. The light emitting device of claim 4, wherein light emitted by the semiconductor diode structure into the transparent substrate and incident on the angular filter at an angle of incidence less than the cut-off angle is transmitted through the angular filter within a cone angle of +/−45 degrees.

6. The light emitting device of claim 5, wherein light emitted by the semiconductor diode structure into the transparent substrate and incident on the angular filter at an angle of incidence less than the cut-off angle is transmitted through the angular filter within a cone angle of +/−5 degrees.

7. The light emitting device of claim 1, wherein transmission through the angular filter of light at angle of incidence 20 degrees or higher is less than 10%.

8. The light emitting device of claim 1, wherein transmission through the angular filter of light at angle of incidence 10 degrees or higher is greater than 50%.

9. The light emitting device of claim 1, wherein the photonic crystal is a one-dimensional photonic crystal.

10. The light emitting device of claim 1, wherein the photonic crystal is a two-dimensional or three-dimensional photonic crystal.

11. The light emitting device of claim 1, wherein the reflective nanostructured layer has a spatial gradient of phase.

12. The light emitting device of claim 1, wherein the nano-antennas comprises at least one of nano-cylinders and nano-cones.

13. The light emitting device of claim 1, wherein the nano-antennas are arranged in a hexagonal or rectangular lattice.

14. The light emitting device of claim 1, wherein the angular filter comprises one or more nanoantennas.

15. A light emitting device comprising:
a semiconductor diode structure;
a substrate transparent to light emitted by the semiconductor diode structure and comprising a top surface, an oppositely positioned bottom surface, and side surfaces connecting the top and bottom surfaces, the bottom surface disposed on or adjacent the semiconductor diode structure;
an angular filter comprising photonic crystals, disposed on or adjacent the top surface of the substrate, and arranged to transmit light emitted by the semiconductor diode structure into the substrate and incident on the angular filter at an angle of incidence less than a cut-off angle and reflect back into the transparent substrate light emitted by the semiconductor diode structure and incident on the angular filter at an angle of incidence greater than or equal to the cut-off angle, such that transmission through the angular filter of light at angle of incidence 35 degrees and higher is 0%; and
comprising a reflective nanostructured layer disposed on or adjacent a bottom surface of the semiconductor diode structure, opposite from the transparent substrate, the reflective nanostructured layer configured to reflect toward the angular filter, at an angle of incidence less than the cutoff angle, light emitted by the semiconductor diode structure and incident on the reflective nanostructured layer at an oblique angle, the reflective nanostructured layer comprising a specular reflector, a dielectric layer disposed between the specular reflector and the substrate, and a periodic arrangement of nano-antennas disposed between the specular reflector and the substrate and spaced apart from the specular reflector by the dielectric layer.

* * * * *